(12) United States Patent
Onizuka et al.

(10) Patent No.: US 6,270,361 B1
(45) Date of Patent: Aug. 7, 2001

(54) CONNECTION STRUCTURE FOR BUS BARS

(75) Inventors: Takahiro Onizuka; Shigeki Yamane, both of Nagoya; Yoshito Oka; Koji Kasai, both of Yokkaichi, all of (JP)

(73) Assignees: Harness System Technologies Research, Ltd., Nagoya; Sumitomo Wiring Systems, Ltd., Mie; Sumitomo Electric Industries, Ltd., Osaka, all of (JP)

( * ) Notice: Subject to any disclaimer, the term of this patent is extended or adjusted under 35 U.S.C. 154(b) by 0 days.

(21) Appl. No.: 09/520,186

(22) Filed: Mar. 7, 2000

(30) Foreign Application Priority Data

Jun. 25, 1999 (JP) .................................. 11-180649

(51) Int. Cl.⁷ ...................................... H01R 9/09
(52) U.S. Cl. ............................................. 439/76.2
(58) Field of Search .................... 439/76.2, 949, 439/723, 724

(56) References Cited

U.S. PATENT DOCUMENTS

| | | | |
|---|---|---|---|
| 2,019,625 | * 11/1935 | O'Brien | 361/805 |
| 4,208,080 | * 6/1980 | Teagno | 439/45 |
| 5,310,353 | * 5/1994 | Parrish et al. | 439/76 |
| 5,322,445 | * 6/1994 | Ozaki et al. | 439/212 |
| 5,801,335 | * 9/1998 | Brussalis et al. | 174/138 G |
| 6,162,990 | * 12/2000 | Sakamoto | 174/59 |

FOREIGN PATENT DOCUMENTS 60-35911 * 2/1985 (JP) .

* cited by examiner

Primary Examiner—Brian Sircus
Assistant Examiner—Thanh-Tam Le
(74) Attorney, Agent, or Firm—Oliff & Berridge, PLC

(57) ABSTRACT

Bus bars 16(A to D) and 17(A to C) on the two faces of an insulating plate 15 can be electrically connected by arranging the longitudinal bus bars 17(A to C) on one face of the insulating plate 15 and the transverse bus bars 16(A to D) on the other face of the insulating plate 15, by fitting recesses 16a to 16d of the bus bars 16(A to D) of at least the one face at the suitable positions of the intersecting portions of the bus bars 16(A to D) and 17(A to C) of the two faces in through holes 15a of the insulating plate 15 to bring the recesses 16a to 16d into contact with the bus bars 17(A to C) of the face, as confronted thereby, and to weld them 16a to 16d to the same bus bars 17(A to C).

5 Claims, 6 Drawing Sheets

CONNECTION STRUCTURE FOR BUS BARS

BACKGROUND OF THE INVENTION

The present invention relates to a connection structure for bus bars to be housed in an electric connection box.

The electric connection box to be used for branching and connecting a wire harness or the like for an automobile with a variety of electrical equipments branches and connects the electric wires rationally and economically by concentrating a branching and connecting point at one point. A variety of types have been developed for different kinds and applications of automobiles as the wire harness grows dense.

One of the aforementioned electric connection boxes is manufactured, as shown in FIG. 8, by punching a hoop material 6 into individual bus bars 7A to 7C by a press mold, by cutting and raising tab terminals 7a and 7b vertically from the pattern portion of each of the bus bars 7A to 7C, by stacking insulating plates 8A to 8C individually between the bus bars 7A to 7C, and by housing the stack in an upper case 9A and a lower case 9B of an electric connection box 9. Here, numeral 10 designates relay terminals, and numerals 11 and 12 designate relays and fuses.

Since the aforementioned individual bus bars 7A to 7C have pattern portions of different shapes, however, they have to be individually punched out by dedicated press molds so that their fabrication costs rise. If the electric connection boxes of the same kind of automobile belong to different grades, the pattern portions of the bus bars have different shapes to raise another problem of lack of flexibility.

SUMMARY OF THE INVENTION

The present invention has been conceived to solve the aforementioned problems of the prior art and has an object to provide a bus bar connection structure which can lower the fabrication cost and which is excellent in the flexibility.

In order to solve the aforementioned problems, according to the present invention, there is provided a connection structure for bus bars to be housed in an electric connection box, characterized: in that there are arranged on one side of an insulating plate longitudinal bus bars which are extended straight in a longitudinal direction at a predetermined pitch where as there are arranged on the other face of the insulating plate transverse bus bars which are extended straight in a transverse direction at a predetermined pitch; in that the insulating plate is provided with through holes at the intersecting portions of the bus bars on the two faces; in that at least one of the bus bars on the two faces is provided at suitable positions of the intersecting portions with recesses to be fitted in the through holes; and in that the recesses are brought into contact with and welded to the bus bars on the confronting face so that the bus bars on the two faces are electrically connected.

According to the present invention, the bus bars on the two faces can be electrically connected by arranging the longitudinal bus bars on one face of the insulating plate and the transverse bus bars on the other face of the insulating plate, by fitting the recesses of at least one of the bus bars of the suitable positions of the intersecting portions of the bus bars on the two faces in the through holes of the insulating plate, and by bringing the recesses into contact with the face, as confronted thereby, and welding them to the confronted face.

If the construction is made such that the individual bus bars on the two faces are provided at their end portions with connector tab terminals which are raised upward, as in Aspect 2, it is unnecessary to weld the tab terminals separately.

If the construction is made such that the individual bus bars on the two faces are cut at suitable portions, as in Aspect 3, another circuit can be formed by making an electric disconnection with the same bus bars.

The construction can be made, as in Aspect 4, such that the bus bars for the lower layer are provided with lower layer compression blades which are extended through slits formed in said insulating plate to over the face of the insulating plate for the upper layer, such that there are arranged on the face of the insulating plate for the upper layer the bus bars which are provided at their two ends with upper layer compression blades confronting the lower layer compression blades and connector tab terminals, and such that jumper electric wires are compressed on the upper layer compression blades and the lower layer compression blades to connect the bus bars on the two faces electrically.

The construction can be made, as in Aspect 5, such that the bus bars for the lower layer are provided with lower layer compression blades which are extended through slits formed in said insulating plate to over the face of the insulating plate for the upper layer, such that there are arranged on the face of the insulating plate for the upper layer connector tab terminals which are provided with compression blades at their lower ends, and such that jumper electric wires are compressed on the compression blades and the lower layer compression blades so that the bus bars for the lower layer and the connector tab terminals for the upper layer are electrically connected.

DETAILED DESCRIPTION OF THE PREFERRED EMBODIMENTS

Figure 1:
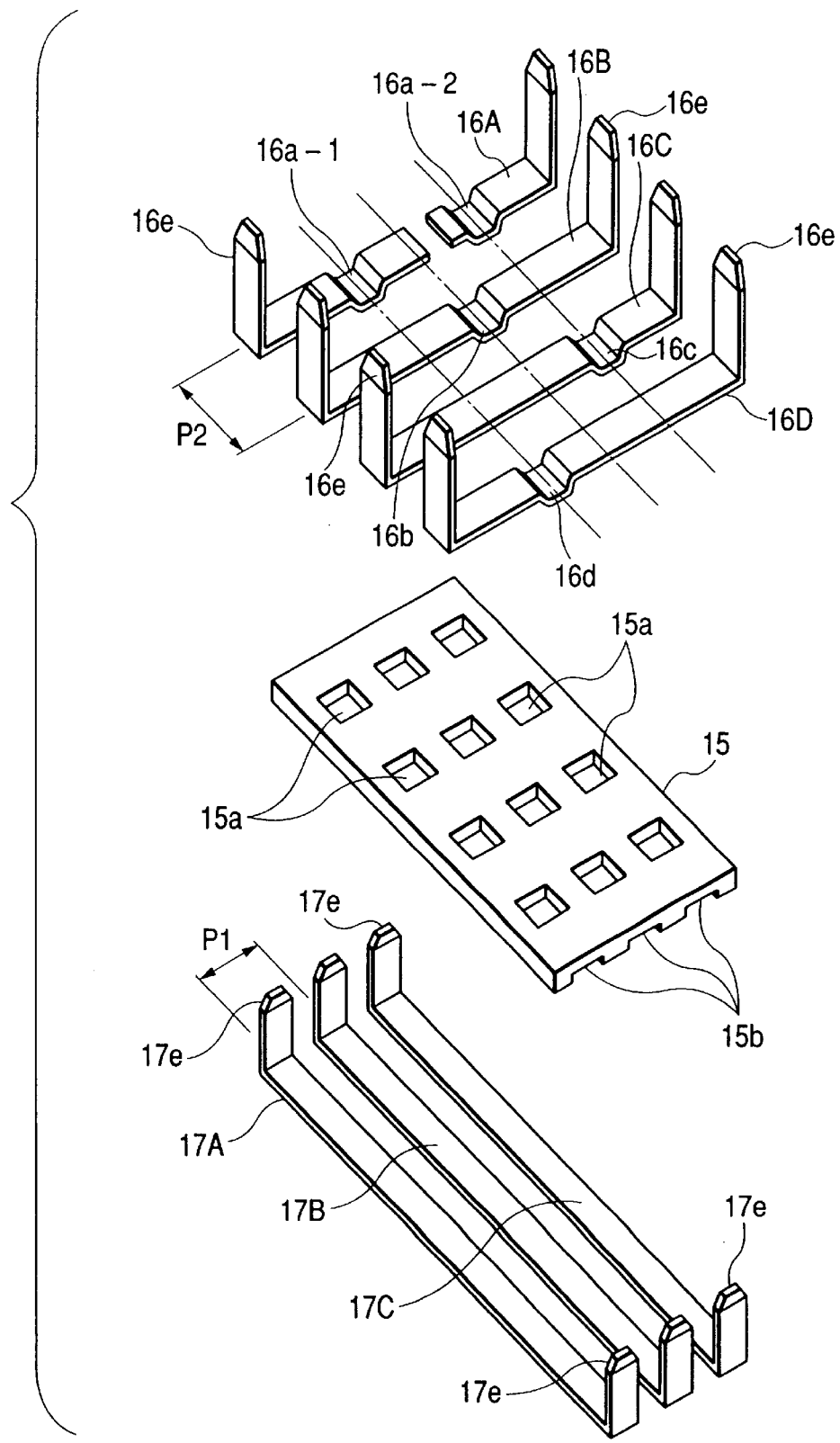
FIG. 1 is an exploded perspective view of a bus bar connection structure of the present invention.

Embodiments of the present invention will be described in detail with reference to the accompanying drawings. Here, the detail description of the same construction and functions as those of the prior art will be omitted by designating them by the common reference numerals.

Figure 2:
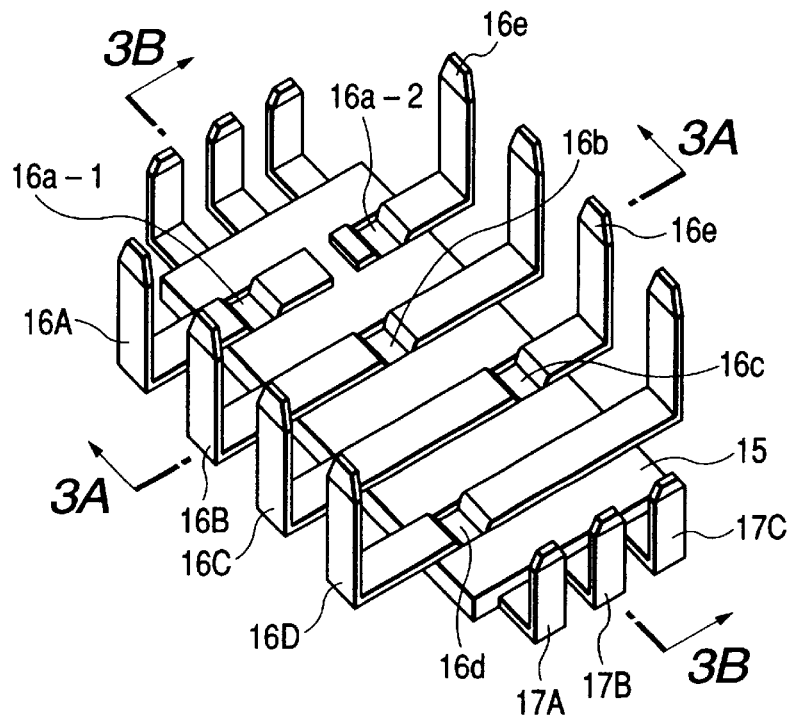
FIG. 2 is a perspective view of an assembly of the bus bar connection structure.
Figure 3A:
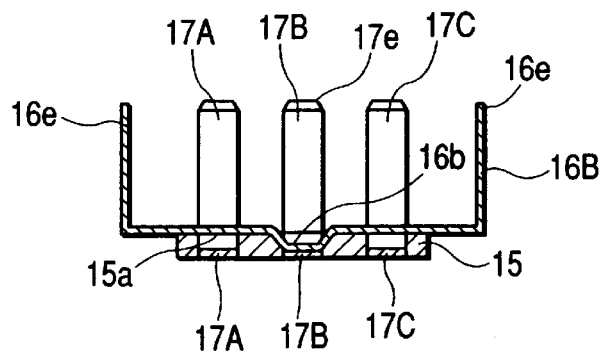
FIG. 3A is a section taken along line A—A of FIG. 2.
Figure 3B:
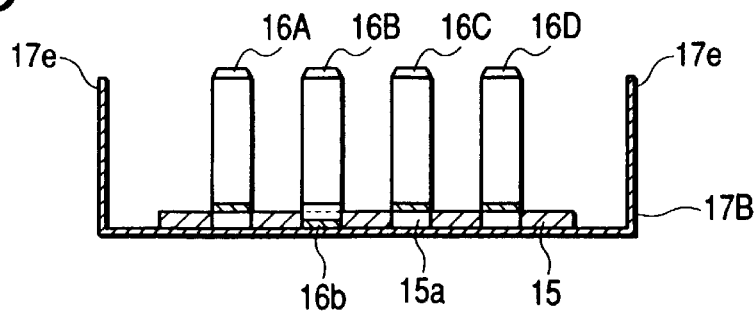
FIG. 3B is a section taken along line B—B of FIG. 2.

On the lower face of a rectangular insulating plate 15, as shown in FIGS. 1 to 3, there are arranged longitudinal bus bars 17A, 17B and 17C which are extended straight in the longitudinal direction at a predetermined pitch P1. On the upper face of the insulating plate 15, there are arranged transverse bus bars 16A, 16B, 16C and 16D which are extended straight in the transverse direction at a predetermined pitch P2.

In the aforementioned insulating plate 15, through holes 15a are formed in a lattice shape in all the intersections of the bus bars 16(A to C) and 17(A to D) on the two faces. In the lower face of the insulating plate 15, on the other hand, there are formed bus bar grooves 15b for fitting the longitudinal bus bars 17(A to C) individually.

At suitable portions for circuit formations in the intersecting portions of the aforementioned individual transverse bus bars 16(A to D) with the individual longitudinal bus bars 17(A to C), there are individually formed recesses 16a to 16d which are to be fitted in the aforementioned through holes 15a so that they are individually brought into contact with the opposed longitudinal bus bars 17(A to C) (as should be referred to FIG. 3).

In this embodiment, a recess 16a-1 of the transverse bus bar 16A contacts with the longitudinal bus bar 17A, and a recess 16a-2 of the contacts with the longitudinal bus bar 17C. Likewise: the recess 16b of the transverse bus bar 16B contacts with the longitudinal bus bar 17b; the recess 16c of the transverse bus bar 16C contacts with the longitudinal bus bar 17C; and the recess 16d of the transverse bus bar 16D contacts with the longitudinal bus bar 17A.

Moreover, the individual recesses 16a to 16d of the transverse bus bars 16(A to D) are electrically connected with the individual opposed longitudinal bus bars 17(A to C) by welding their contacting portions individually by means of a laser.

The two end portions of the aforementioned transverse bus bars 16(A to D) and longitudinal bus bars 17(A to C) are raised upward to form connector tab terminals 16e and 17e. Here, the transverse bus bar 16A is cut between the recesses 16a-1 and 16a-2 so that it can be disconnected.

With the aforementioned construction, the bus bars 16(A to D) and 17(A to C) on the upper and lower faces of the insulating plate 15 can be electrically connected by arranging the transverse bus bars 16(A to D) on the upper face of the insulating plate 15 and the longitudinal bus bars 17(A to C) on the lower face of the insulating plate, by fitting the recesses 16a to 16d of the transverse bus bars 16(A to D) in the through holes 15a of the insulating plate 15 to weld them to the opposed longitudinal bus bars 17(A to C).

As the bus bar structure, therefore, the insulating plate 15 and the longitudinal bus bars 17(A to C) can be made completely common, and the transverse bus bars 16(A to D) can also be made common by forming the positions of the recesses 16a to 16d later. The bus bar structure is made merely by arranging those straight longitudinal bus bars 17(A to C) and transverse bus bars 16(A to D) in combination, and by welding the recesses 16a to 16d at the intersecting portions. Unlike the prior art, therefore, the bus bars need not be punched into different pattern shapes by dedicated press molds, as in the prior art, thereby to lower the fabrication cost.

Merely by changing the positions of the recesses 16a to 16d of the transverse bus bars 16(A to D), on the other hand, the structure can respond to any bus bar pattern shape to reduce the number of steps of designing the circuit remarkably and to respond a design change accompanying a slight circuit change quickly thereby to improve the flexibility drastically.

Since the connector tab terminals 16e and 17e are individually formed at the two end portions of the individual bus bars 16(A to D) and 17(A to C), moreover, they need not be separately welded so that the fabrication cost is lowered.

Still moreover, the transverse bus bar 16A is cut so that even an identical bus bar can be electrically disconnected to make another circuit.

In the aforementioned embodiment, the transverse bus bars 16(A to D) are provided with the recesses 16a to 16d.

On the contrary, the longitudinal bus bars 17(A to C) may be provided with recesses and welded to the transverse bus bars 16(A to D). On the other hand, the transverse bus bars 16(A to D) and the longitudinal bus bars 17(A to C) may be individually provided with recesses, and these recesses may be welded in the through holes 15a.

Figure 4:
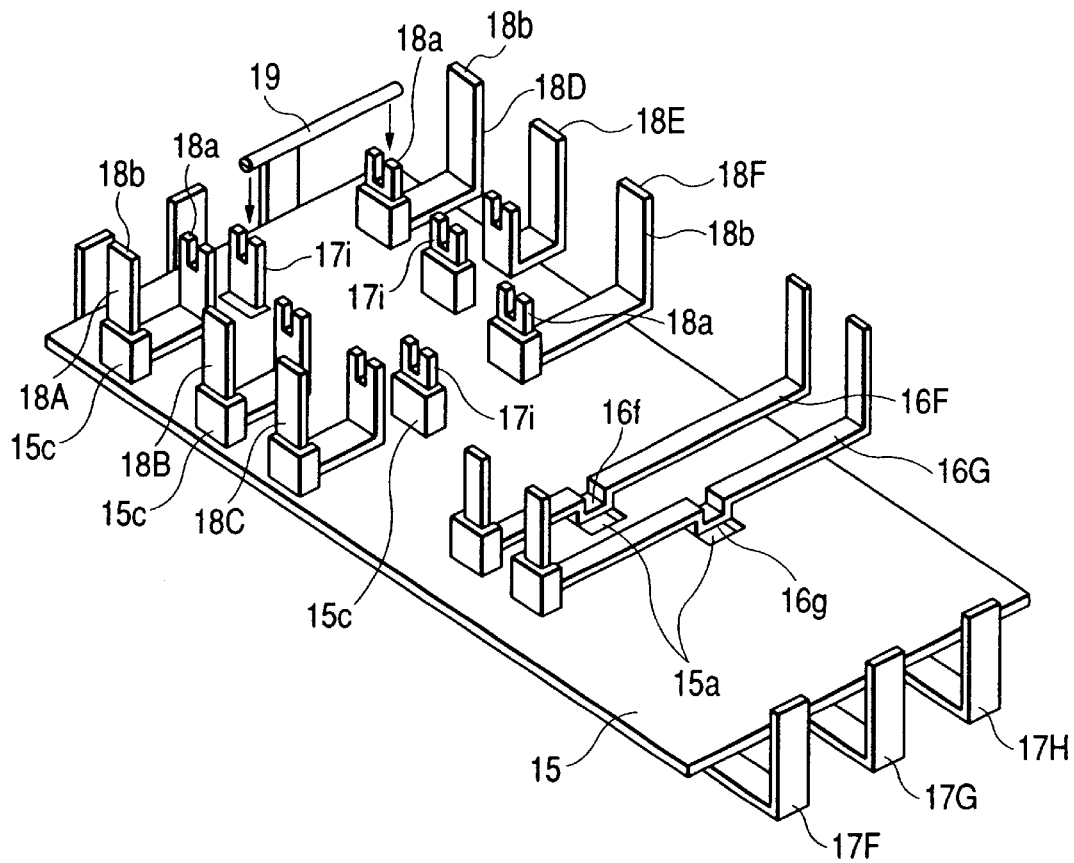
FIG. 4 is a perspective view of a bus bar connection structure of a first application embodiment.
Figure 5:
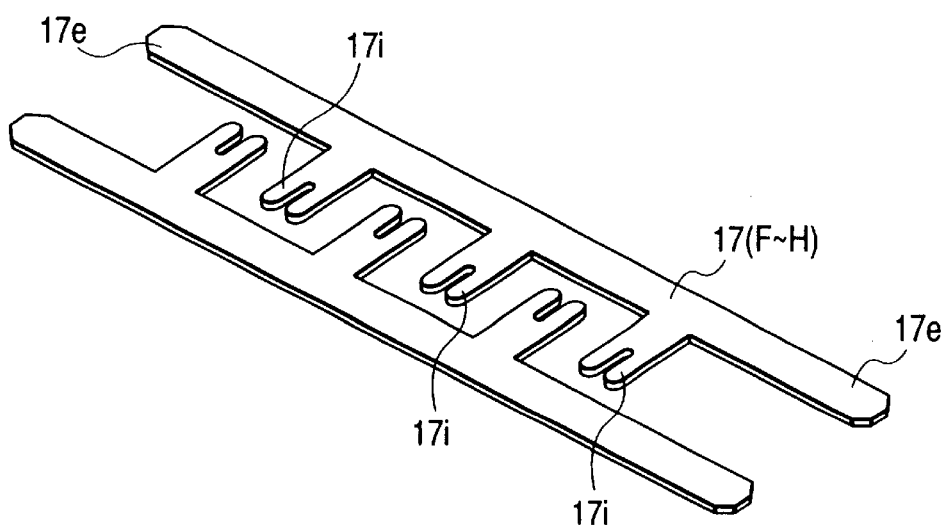
FIG. 5 is an exploded perspective view of longitudinal bus bars.
Figure 6A:
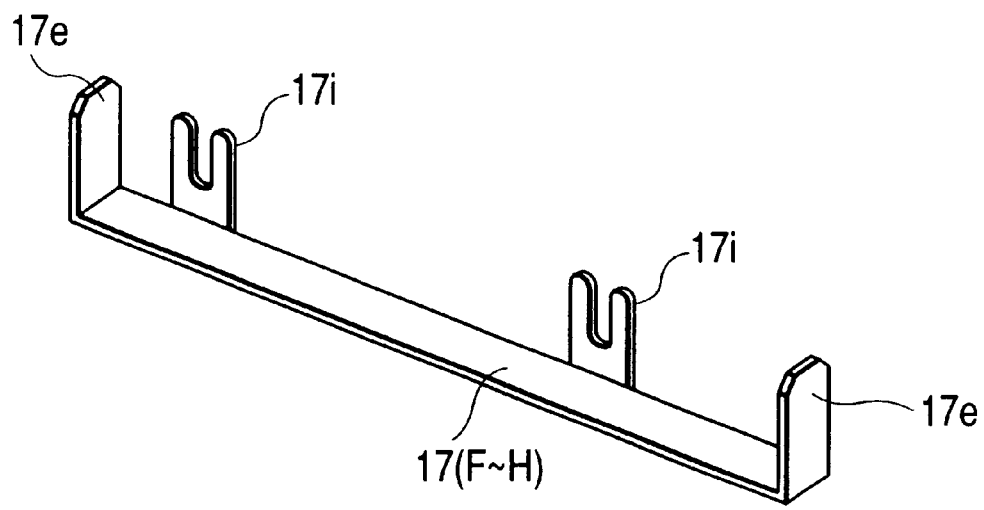
FIG. 6A is a perspective view of the longitudinal bus bar folded.
Figure 6B:
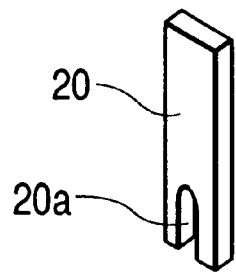
FIG. 6B is a perspective view of a tab terminal.

FIG. 4 to FIG. 6A show a first application embodiment, in which transverse bus bars 16F and 16G are basically given the same shape as that of the aforementioned transverse bus bars 16(A to D). On the other hand, longitudinal bus bars 17F to 17H are also basically given the same shape as that of the aforementioned longitudinal bus bars 17(A to C). As shown in FIG. 5, however, lower layer compression blades 17i are formed integrally with the side edge portions of the longitudinal bus bars 17F to 17H and are raised upward, as shown in FIG. 6A, like the connector tab terminals 17e. Here, the lower layer compression blades 17i other than the necessary ones are cut off by means of a press. As shown in FIG. 5, on the other hand, the longitudinal bus bars 17F to 17H can spare their own material to improve the yield, if they are blanked to stagger the lower layer compression blades 17i.

Moreover, recesses 16f and 16g of the aforementioned individual transverse bus bars 16(F, G) are fitted in the through holes 15a of the insulating plate 15 and are individually brought into contact with the opposed longitudinal bus bars 17(F to H), so that they are electrically connected by welding the contacting portions individually by means of a laser.

On the upper face of the aforementioned insulating plate 15, on the other hand, there are individually arranged U-shaped transverse bus bars 18A to 18F which are provided with upper layer compression blades 18a and connector tab terminals 18b at their two ends, as shown in FIG. 4. The upper layer compression blades 18a of those individual transverse bus bars 18(A to F) are confronted by the lower layer compression blades 17i of the aforementioned longitudinal bus bars 17(F to H), as extended through the (not-shown) slits formed in the aforementioned insulating plate 15 to over the upper face of the insulating plate 15.

Moreover, jumper electric wires 19 are compressed on the upper layer compression blades 18a and the lower layer compression blades 17i so that the bus bars 18(A to F) and 17(F to H) on the upper and lower faces of the insulating plate 15 can be electrically connected with ease. Here, in order to reinforce the upper layer compression blades 18a of the transverse bus bars 18A to 18F and the connector tab terminals 18b or the lower layer compression blades 17i of the longitudinal bus bars 17F to 17H, it is preferable to form C-shaped or cylindrical reinforcing portions 15c on the upper face of the insulating plate 15.

Figure 7:
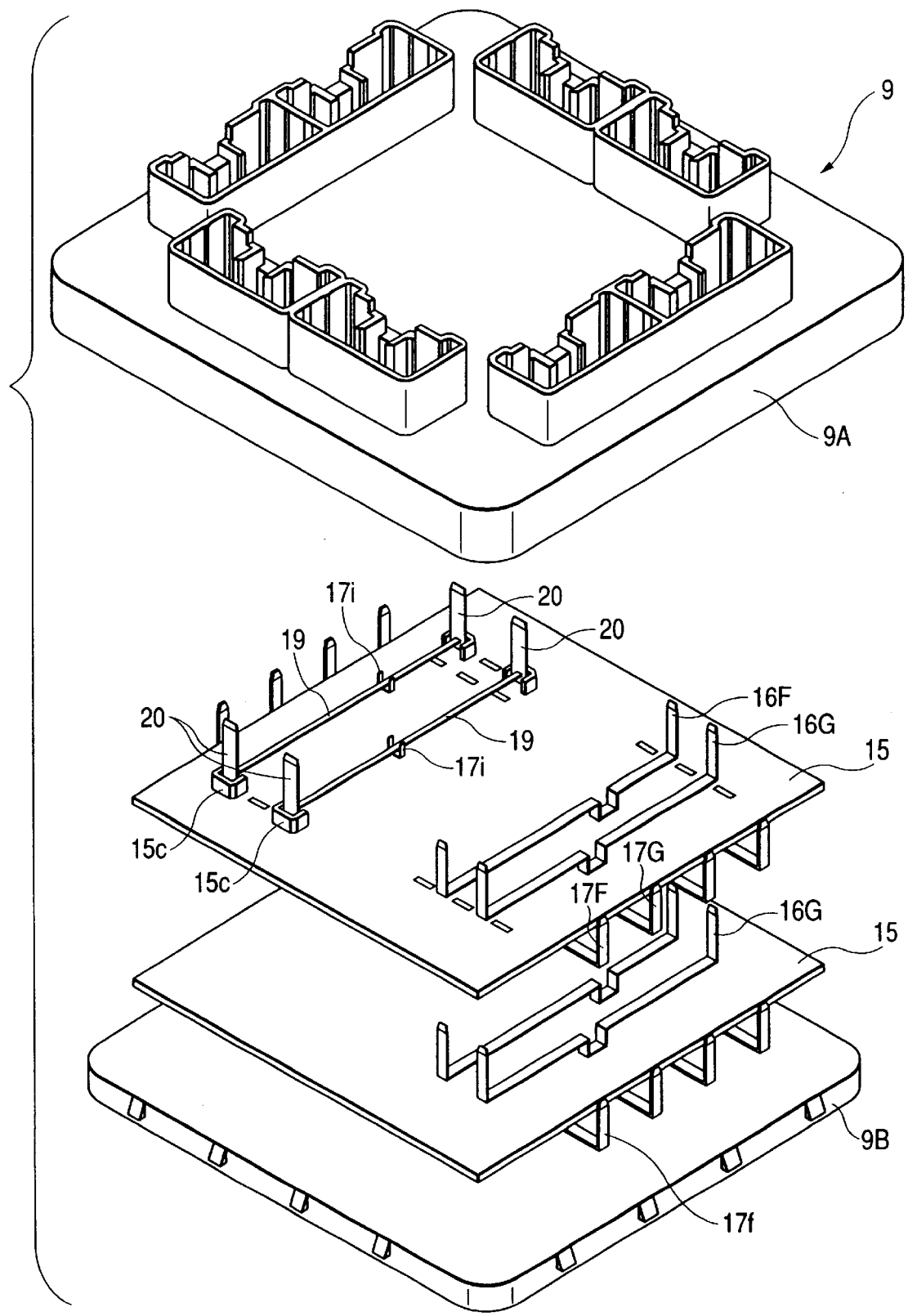
FIG. 7 is a perspective view of a bus bar connection structure of a second application embodiment.
Figure 8:
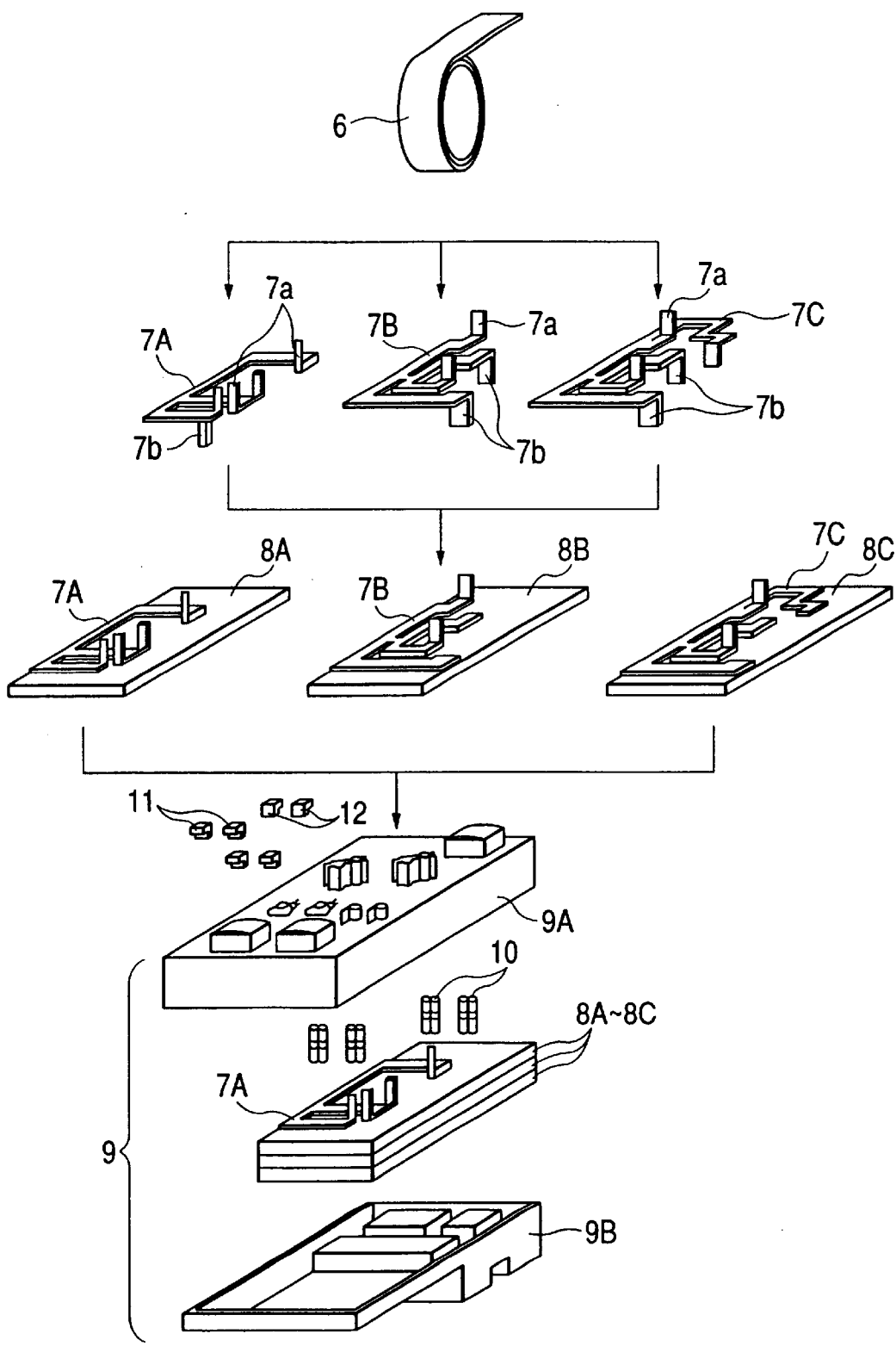
FIG. 8 is a perspective view of a process for fabricating the bus bars of the prior art.

On the other hand, FIG. 7 shows a second application embodiment. On the upper face of the aforementioned insulating plate 15, there are individually arranged I-shaped bus bar connector tab terminals 20 (as referred to FIG. 6B) which are provided with compression blades 20a at their lower ends. The compression blades 20a of those individual tab terminals 20 are confronted by the lower layer compression blades 17i of the aforementioned longitudinal bus bars 17(F to H), as are extended through the (not-shown) lists formed in the aforementioned insulating plate 15 to over the upper face of the insulating plate 15.

Moreover, the jumper electric wires 19 are compressed on the compression blades 20a of the tab terminals 20 and the lower layer compression blades 17i of the longitudinal bus bars 17(F to H) so that the tab terminals 20 on the upper face of the insulating plate 15 and the bus bars 17(F to H) on the lower face can be electrically connected with ease.

In a bus bar connection structure of the present invention, as apparent from the description thus far made, the bus bars on the two faces can be electrically connected by arranging the longitudinal bus bars on the one face of the insulating plate and the transverse bus bars on the other face of the insulating plate, by fitting the recesses of the bus bars of at least one face at the suitable positions of the intersecting portions of the bus bars of the two faces in the through holes of the insulating plate to bring the recesses into contact with the bus bars of the face, as confronted thereby, and to weld them to the same bus bars.

As a result, the bus bars are made merely by arranging those common, straight longitudinal bus bars and transverse bus bars in combination, and by welding the recesses at the intersecting portions connecting the upper and lower layer bus bars. Unlike the prior art, therefore, the bus bars need not be punched into different pattern shapes by dedicated press molds, as in the prior art, thereby to lower the fabrication cost.

Merely by changing the positions of the recesses, on the other hand, the structure can respond to any bus bar pattern shape to reduce the number of steps of designing the circuit remarkably and to respond a design change accompanying a slight circuit change quickly thereby to improve the flexibility drastically.

If the construction is made such that the raised connector tab terminals are formed at the end portions of the individual bus bars of the two faces, as in Aspect 2, they need not be separately welded so that the fabrication cost is lowered.

If the construction is made such that the individual bus bars of the two faces are cut at their suitable portions, as in Aspect 3, even an identical bus bar can be electrically disconnected to make another circuit.

If the construction is made such that the jumper electric wires are compressed on the lower layer compression blades of the bus bars for the lower layer and the upper layer compression blades of the bus bars for the upper layer, as in Aspect 4, or such that the jumper electric wires are compressed on the lower layer compression blades of the bus bars for the lower layer and the compression blades of the tab terminals of the connectors for the upper layer, as in Aspect 5, the bus bars for the lower layer and the bus bars for the upper layer or the connector tab terminals can be electrically connected with ease.

What is claimed is:

1. A connection structure for bus bars to be housed in an electric connection box comprising:

longitudinal bus bars which are extended straight in a longitudinal direction at a predetermined pitch on a first face of an insulating plate;

transverse bus bars which are extended straight in a transverse direction at a predetermined pitch on a second face of said insulating plate; wherein said insulating plate has through boles at a first predetermined location at intersecting portions of said bus bars on the first and second faces;

at least one of said bus bars on the first and second faces is provided with at least one preformed recessed portion at a second predetermined location corresponding to the first predetermined location of the through holes so that the recessed portion can be fitted in the through holes; and the at least one preformed recess is brought into contact with and welded at the through holes so that said bus bars on the first and second faces are electrically connected.

2. The bus connection structure as set forth in claim 1, wherein said individual bus bars on the first and second faces are provided with end portions having connector tab terminals which are raised upward.

3. The bus bar connection structure as set forth in claim 1, wherein said individual bus bars on the first and second faces are cut at suitable lengths.

4. A connection structure for bus bars to be housed in an electric connection box comprising:

longitudinal bus bars which are extended straight in a longitudinal direction at a predetermined pitch on a first face of an insulating plate;

transverse bus bars which are extended straight in a transverse direction at a predetermined pitch on a second face of said insulating plate; wherein said insulating plate has through holes at intersecting portions of said bus bars on the first and second faces;

said bus bars for the first face are provided with lower layer compression blades which are extended through slits formed in said insulating plate to the second face of said insulating plate, on the second face of said insulating plate, said bus bars are provided at two ends thereof with upper layer compression blades confronting the lower layer compression blades and connector tab terminals, and jumper electric wires are compressed on the upper layer compression blades and the lower layer compression blades to connect said bus bars on the two faces electrically.

5. The bus bar connection structure as set forth in claim 4, wherein said bus bars for the first face are provided with lower layer compression blades which are extended through slit formed in said insulating plate to the face of said insulating plate for the upper layer, on the second face of the insulating plate for the, connector tab terminals are provided with compression blades at their lower ends, jumper electric wires are compressed on the upper and lower layer compression blades so that said bus bars for the first face and said connector tab terminals for the second face are electrically connected.

* * * * *